United States Patent [19]

Acosta et al.

[11] Patent Number: 4,717,591
[45] Date of Patent: Jan. 5, 1988

[54] PREVENTION OF MECHANICAL AND ELECTRONIC FAILURES IN HEAT-TREATED STRUCTURES

[75] Inventors: Raul E. Acosta, White Plains; Wilma J. Horkans, Ossining, both of N.Y.; Ruby Mukherjee, San Jose, Calif.; Judith D. Olsen, Goldens Bridge, N.Y.

[73] Assignee: International Business Machines Corporation, Armonk, N.Y.

[21] Appl. No.: 836,781

[22] Filed: Mar. 6, 1986

Related U.S. Application Data

[63] Continuation of Ser. No. 509,742, Jun. 30, 1983, abandoned.

[51] Int. Cl.$^4$ .......................... C23C 18/36; H05K 3/46
[52] U.S. Cl. .......................................... 427/96; 427/98; 427/437; 427/443.1
[58] Field of Search ..................... 427/98, 437, 443.1, 427/96

[56] References Cited

U.S. PATENT DOCUMENTS

| | | | |
|---|---|---|---|
| 4,002,778 | 1/1977 | Bellis | 427/98 |
| 4,232,060 | 11/1980 | Mallory | 427/98 |
| 4,349,585 | 9/1982 | Nagashima | 427/438 |
| 4,386,116 | 5/1983 | Nair | 427/99 |
| 4,503,131 | 3/1985 | Baudrand | 427/98 |

Primary Examiner—John D. Smith
Attorney, Agent, or Firm—Jackson E. Stanland

[57] ABSTRACT

This invention relates to the prevention of mechanical and electrical failures in structures that are heat-treated, and more particularly relates to the use of coating layers containing Co and P on corrosible materials such as Cu. The invention has significant utility in the protection of Cu current-carrying lines in electronic structures that comprise multi layers that are subjected to heat treatments that would normally adversely affect the Cu lines. The CoP coating layer also acts to prevent interdiffusion between Cu and contact metals, such as Au.

11 Claims, 7 Drawing Figures

PREVENTION OF MECHANICAL AND ELECTRONIC FAILURES IN HEAT-TREATED STRUCTURES

This is a continuation of Ser. No. 509,742 filed June 30, 1983, now abandoned.

BACKGROUND ART

Current-carrying lines are often fabricated from materials such as copper and its alloys, which are readily corrosible in different atmospheres. In particular, packages of microelectronic circuitry commonly comprise a substrate, at least one layer of copper current-carrying lines, at least one layer of an organic dielectric material (such as polyimide) which serves as an insulator, and additional layers of current-carrying lines. These structures have to be heat-treated in order to cure the organic dielectric.

During the curing cycles these organic materials often release water as a by-product. Also, even after these organic dielectrics are cured, they remain permeable to water and to other atmospheric contaminants. If the package incorporates copper or some other oxidizable or corrosible metal or alloy, the vulnerable metal must be protected in order to prevent the degradation of the circuitry over time.

Although many possible protective coating materials can be envisioned, the potential number of suitable materials is severely limited by another requirement of the electronic package. It is often the situation that there is physical contact established between one metal or alloy and another. During the package processing steps, such as curing, soldering, and brazing, the structure is often exposed to thermal cycling for prolonged periods of time. Unless the regions of metal-to-metal contact are prevented from interdiffusion during the periods of thermal cycling, the electronic properties of the package will be altered. In particular, interdiffusion between metals will adversely affect the conductivity of the metals. For current-carrying lines of small dimensions, this is a particularly severe problem.

Thus, the current-carrying lines have to be protected against all sorts of chemical attack, including oxidation, and must be protected against interdiffusion with other metals which the current-carrying lines contact. Chemical attack and interdiffusion will not only impair the conductivity of the current-carrying lines, but may also adversely affect the adhesion of these lines to an organic dielectric. For example, it is known in the art that polyimides do not adhere well to copper, and consequently an adhesion layer (such as Cr) is used between the copper and the polyimide. The poor adhesion of copper to polyimide may be due to the formation of a loosely adhering copper oxide on the surface of the copper.

These problems are generally known in the art, and reference is made to the following examples of background art:

J. E. Turn and E. L. Owen, "Metallic Diffusion Barriers for the Copper-Electrodeposited Gold System", AES Research Project, Plating, Nov. 1974, at page 1915.

M. R. Pinnel et al, "Mass Diffusion in Polycrystalline Copper/Electroplated Gold Planar Couples", Metallurgical Transactions, Vol. 3, July 1972, p. 1989.

R. W. Lindsay et al, "The Structure and Mechanical Properties of Electroless Nickel", J. Electrochemical Soc., Vol. 112, No. 4, p. 401, Apr., 1965.

U.S. Pat. Nos. 4,065,588 and 4,188,438.

Flexibility of fabrication is achieved if the coating that provides protection against chemical attack, protection against interdiffusion, and adhesion of the line is capable of electroless deposition. If the protective coating must be electroplated, a plating base would be required which would also require an additional masking step. In addition, protecting a line by plating through a mask would only cover the top of the line; electroless deposition protects all sides. After electroplating, a step to remove the contact layer would be required. Since the current-carrying lines are often extremely small, it is difficult to provide electrical contact to them for electroplating. Even if electrical lands are provided, the IR drop is great with extremely long and small lines, so the amount of current available for plating would be restricted and poor plating would often result. Thus, use of a material capable of electroless plating deposition provides a simpler method of protecting all of the exposed sides of the corrosible line. The use of techniques such as evaporation and sputtering for the deposition of the coating layer is not sufficient, since all three exposed sides of the corrosible material will not be protected.

In the prior art, materials such as Cr, Ni, and NiP have been used as protective coatings. However, these materials are not totally suitable with respect to the aforementioned interdiffusion problem, and some (such as Cr) cannot be electrolessly plated.

When Cr is electroplated, the plating solution contains catalysts which facilitate electron transfer to the Cr ions, but the current efficiency remains very low. Thus, the use of Cr as protection for all sides of a Cu line would entail the use of a complicated electrodeposition process. Although there are obscure literature references to electroless deposition of Cr, electrochemical studies of this system indicate that electroless Cr deposition cannot be achieved. In any event, it is significantly more desirable to use straightforward processing to cover all exposed sides of the current-carrying lines.

Nickel was found not to be an adequate cladding material because of its extensive interdiffusion with Cu. Electrolessly deposited NiP and NiB alloys are superior to pure Ni, but still cause a substantial increase in the resistance of copper lines. The extent of interdiffusion of these alloys with copper does not show a straightforward dependence on the concentration of the alloying atom. Cobalt diffuses with Cu to a lesser extent than does Ni, but still does not provide truly effective protection against chemical attack and a sufficient interdiffusion barrier.

Accordingly, it is an object of this invention to provide a material that offers good protection against chemical attack of underlying copper or other corrosible lines and that prevents interdiffusion between the copper or other corrosible material and any metal or alloy with which it may be in contact.

It is another object of this invention to provide an improved coating material that can be used to prevent chemical attack of corrosible lines and interdiffusion between these lines and other contacting metals.

It is another object of this invention to provide an improved protective coating material for use with copper lines, which will protect the copper lines from all types of chemical attack.

It is another object of this invention to provide a material that will protect copper lines from corrosive chemical attack, and that can be used as an interdiffusion barrier between the copper lines and other metals.

It is a further object of the present invention to protect copper lines using a coating layer that can be electrolessly deposited.

It is another object of this invention to provide an improved coating material for copper lines, which is effective when electrolessly deposited in thin layers.

It is another object of this invention to provide an improved electronic package that contains organic dielectric material and current carrying metallic lines, where the metallic lines are protected against corrosion and interdiffusion by an improved layer of protective material.

It is a further object of this invention to provide an improved protective coating for copper and other corrosible materials, which coating can be deposited as a thin film and which will prevent chemical attack of the copper or corrosible material and also interdiffusion between the copper or other corrosible material and other metals.

It is a further object of this invention to provide a protective coating layer of CoP on Cu lines.

It is another object of the present invention to provide an improved interdiffusion barrier that can be used between copper and other metals, such as gold, and that will prevent interdiffusion between the copper and these other metals.

DISCLOSURE OF THE INVENTION

In the broadest aspect of this invention, a coating of CoP is provided on Cu lines or other lines composed of corrosible materials, in order to protect the lines. The CoP layer can be made very thin and will protect the underlying lines from chemical attack and also from interdiffusion with other materials to which physical contact is made.

In another aspect of this invention, an electronic package is provided having a substrate, at least one layer of current-carrying lines composed of copper or another corrosible material, at least one insulating layer generally an organic dielectric, and a layer of CoP deposited on and in contact with the current-carrying lines. This structure can be subjected to heat treatments such as those used for curing, soldering, brazing, etc., without chemical attack of the copper or other corrosible materials. Further, the CoP acts as an interdiffusion barrier between the lines and any other materials which are in contact with the CoP-protected lines. In a particular example, the CoP acts as an interdiffusion barrier between Cu and Au.

The CoP can be present in many forms, including as a compound or an amorphous mixture, or a mixture of Co and CoP compound. In general, the protective coating includes Co and P, and the P is present in amount at least about 2%, by weight. As an example, 8%P provides a suitable coating in a thickness of approximately 1000 Å.

CoP can be electroplated or electrolessly plated, although electroless plating is a particular advantage, as previously pointed out. The use of CoP as a protective coating has a very important utility in microelectronic structures where the current-carrying lines are very small. For example, a structure of particularly critical importance is one in which a substrate providing mechanical support, such as Si, ceramic, or glass, has thereover a layer of thin copper lines, typically having widths of 6–50 micrometers and thicknesses 6–50 micrometers. The copper lines are protected by a coating of CoP having a thickness of about 500 Å or more. The CoP coating has a minimum thickness which will provide a continuous thin film and a maximum thickness normally set by the dimensions required for the electronic package. That is, the protective coating must be continuous and of a thickness to prevent corrosion and interdiffusion (if necessary), and must not be so thick as to substantially alter the sizes required for the current-carrying lines. It is this microelectronic structure which forms a significant part of this invention.

These and other objects, features, and advantages will be apparent from the following more particular description of the preferred embodiments.

BEST MODE FOR CARRYING OUT THE INVENTION

In the practice of this invention it has been discovered that a protective coating including Co and P will provide very effective protection against chemical attack of an underlying corrosible conductor, such as copper, and will also provide an effective interdiffusion barrier between the corrosible conductor and other metal layers which contact the conductor. This protection leads to an improved thin film package in which very thin and narrow conductor lines can be effectively used in a package containing layers of organic dielectric which package has to be heat treated for process steps such as curing, soldering, brazing, etc.

Figure 1:
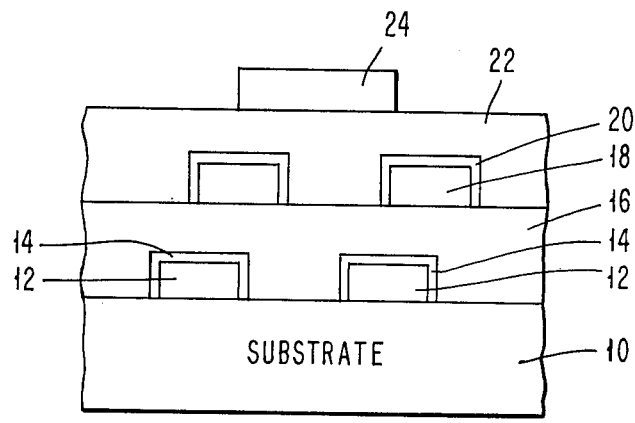
FIG. 1 is an end view of a structure representative of the type in which the invention has particular utility, the structure being composed of a microelectronic package including at least one layer of a corrosible conductor which is protected by a layer including Co and P.
Figure 2:
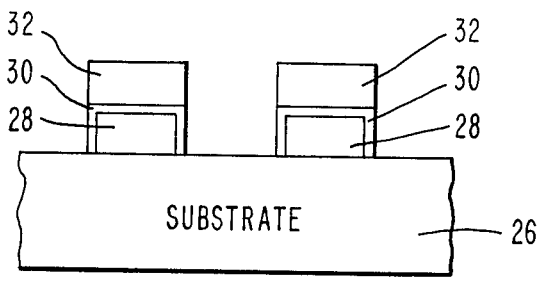
FIG. 2 is an end view of a representative structure in which a coating including Co and P is used to protect a corrosible conductor and also to prevent interdiffusion between the conductor and another metal.

FIGS. 1 and 2 represent typical structures in which protection against chemical attack and interdiffusion is required. In FIG. 1, a substrate 10, such as glass, ceramic, silicon, etc., has thereon a first conductive level comprising the conductors 12. These conductors are typically copper, an alloy of copper, or other materials which often contain copper. Conductors 12 are, therefore, composed of corrosible material. For this reason, a thin protective coating layer 14, or cladding, is deposited on the conductors 12. An insulating layer 16, typically an organic dielectric such as polyimide, is deposited over the protected conductors 12. In many multilayer packages, another layer of corrosible conductors 18 would be provided which is also protected by a protective layer 20 of CoP. This is followed by the deposition of a second insulating layer 22 which also can be composed of an organic dielectric such as polyimide. Finally, a third conductive layer 24 is provided, which is used for other current-carrying or contact functions in the overall micro-electronic package represented by FIG. 1.

FIG. 2 illustrates a structure in which the CoP protective layer is also used as an interdiffusion barrier. In FIG. 2, a substrate 26, similar to the substrate 10 of FIG. 1, has a layer of corrosible conductors 28 thereon. Again, these conductors are typically copper or an alloy of copper. A thin protective layer 30 of CoP is deposited on the conductors 28 and serves to protect them from chemical attack. Protective layer 30 also serves as an interdiffusion barrier between the conductors 28 and an overlying metal layer 32. For example, conductors 28 can be comprised of copper or an alloy of copper, while metal layer 32 can be another conductor such as gold. The CoP protection layer prevents interdiffusion between conductor 28 and metal layer 32. In contrast with other protective layer compositions, such as those to be described with respect to FIGS. 3-7, CoP provides a very effective interdiffusion barrier between copper and gold. The types of conductors that are protected by the CoP protective layer include any type of conductor that is more corrosible than CoP, and is particularly exemplified by conductors comprising copper or alloys of copper. In particular, the invention has for a primary object the protection of conductors which contain copper, the protection being against any type of corrosive attack as well as against interdiffusion with other metals.

The CoP protective material can take any structural form, including amorphous and crystalline structures. A compound of cobalt and phosphorous is suitable, as well as alloys, mixtures of Co and compounds of CoP, and mixtures including Co and P. The protective layer has to be pinhole free and continuous in order to provide the protective function, and its thickness is generally that which will provide protection against corrosion and protection against interdiffusion, if the conductor is to be contacted by another metal or any material with which it might interdiffuse. As an example, an alloy comprising 8% phosphorous with the remainder cobalt is particularly suitable at a thickness of about 1000 Å. However, thicknesses down to about 500 Å also appear to be suitable, and greater thicknesses than 1000 Å can also be used. Depending upon the structure in which the protective CoP coating is to be used, the upper limit on thickness is quite arbitrary.

The percentage of phosphorous in the coating can be extended over a fairly wide range, and is generally about 2 to about 15%, by weight. These percentages have been found to be particularly useful when the copper is to be protected from corrosion and interdiffusion with other metals, such as gold. In particular, these percentages are particularly suitable for use in multilayer structures comprising organic dielectrics and copper conductive lines of small dimensions. An advantage of the present invention is that the protective properties of layers containing Co and P are not very sensitive to the amount of P which is present. Generally, at temperatures less than about 400° C., interdiffusion between copper and a contacting metal proceeds by grain boundary diffusion. As the CoP-clad copper film is heated, $Co_3P$ precipitates in increasing amounts in the grain boundaries, thereby effectively blocking the grain boundary diffusion process.

The CoP protective layer can be electrolessly deposited on the three exposed sides of the conductor lines. In order to initiate electroless deposition on copper, a Pd catalyst is first deposited. A ten second immersion in a room temperature solution of 0.1 g/l Pd $Cl_2$, pH 2 with HCl, followed by a thorough rinse, gives reliable initiation of the electroless process. This treatment will give a Pd coverage on the copper of <0.5 μg/cm². This procedure gives good coverage of the copper, but in the plating of patterned copper lines, metal deposition sometimes occurs on the organic dielectric between closely spaced lines (so-called extraneous deposition or bridging). In an effort to reduce this extraneous deposition, a rinse is sometimes used between the Pd activation step and the electroless deposition of CoP. This rinse is either an aqueous $NH_3$ solution of pH 11.2 or a 0.2M EDTA solution of pH 7.0 (pH adjusted with NaOH).

A representative solution for electroless deposition of CoP, 8%P, has the following composition:

| | |
|---|---|
| $CoSO_4.7H_2O$ | 35 g/l |
| $NaH_2PO_2.H_2O$ | 40 g/l |
| Trisodium citrate, dihydrate | 35 g/l |
| $(NH_4)_2SO_4$ | 70 g/l |
| pH (with $NH_3$) | 9.5 |
| Temperature | 85° C. |
| Mild Agitation | |
| Rate | 2100 Å/min |

References describing the electrodeposition of CoP alloys are U.S. Pat. Nos. 3,073,762 and 3,202,590.

FIGS. 3-7

These figures are various plots of the resistivity of copper lines, both protected and unprotected, measured as a function of annealing temperature, for different temperature-time intervals of the annealing cycle. In the evaluation of different cladding metals, an increase in resistivity relative to that of the unclad line is an indication of interdiffusion between the two metals. After each temperature-time interval of the anneal, the sample was cooled in vacuum to room temperature, and its sheet resistivity ρ was measured using a 4-point probe. The resistivity varied from sample to sample because of variations of grain size, density, impurities, etc. For this reason, all results were normalized to the resistivity $\rho_o$ of the as-deposited sample. In these plots, the relative resistivity of the copper line is given by $\rho/92_o$, and the horizontal axes of the plots indicates the temperature (°C.), while the numbers in parentheses below the temperatures indicate the times in minutes, at that temperature.

Resistance measurements were also used to indicate loss of conducting copper metal by oxidation during curing of polyimide, which is a commonly used organic dielectric in electric and electronic packaging. Some sheet samples were measured with a standard 4-point probe by scraping away some of the polyimide at the center of the sample. Since this scraping procedure may damage copper in the vicinity of the probe and thus adversely affect the resistance measurement, the method of Van der Pauw was used (Phillips Res. Repts., 13, 1, 1958) to measure the resistance of the sheet samples. That method involves removal of polyimide to form four arbitrarily placed contacts on the circumference of the sample. Pattern samples were also prepared for 4-point probe measurement of the increase of resistance of a copper line upon polyimide cure.

The interdiffusion between the various protective materials illustrated in FIGS. 3–7 and the copper line was studied by submitting examples to a vacuum anneal simulating the temperature excursions encountered in curing polyimide. The samples were annealed in a vacuum of $10^{-7}$ torr, in order to prevent the effects of interdiffusion of the metals from being confused by the effects due to oxidation.

Figure 3:
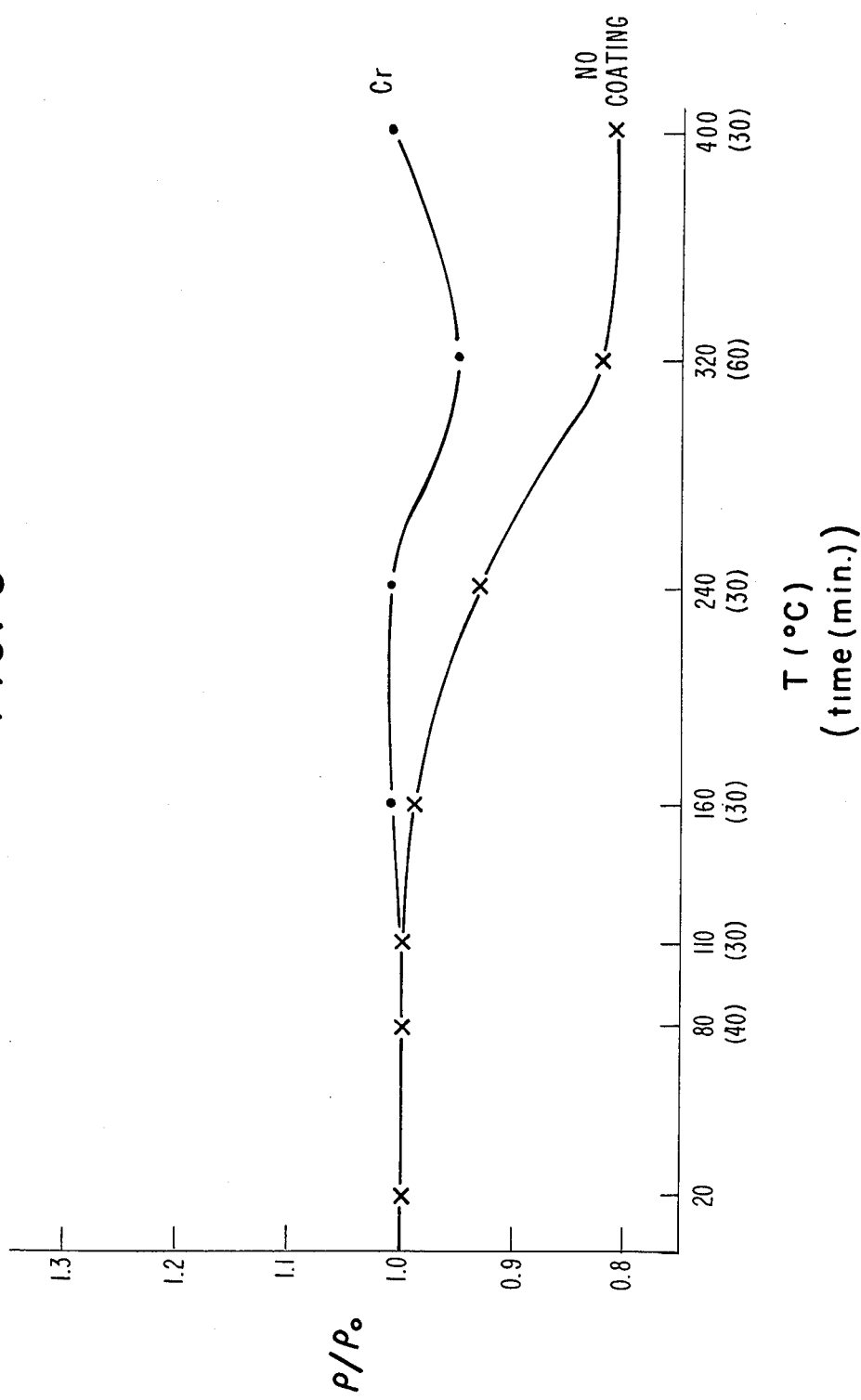
FIG. 3 is a plot showing the dependence of the relative resistivity $\rho/\rho_o$ on an annealing cycle, various times and temperatures being shown for an annealed copper line which is uncoated, and an annealed copper line which has a coating of Cr.

In order to determine the extent of interdiffusion between copper and the various cladding materials being evaluated, the annealing behavior of copper must first be known. FIG. 3 shows the dependence of the relative resistivity of an unprotected copper film upon annealing. The time the sample remains at each temperature is given in parentheses. The sample consisted of 2.2 $\mu$m of electroplated copper on a substrate with an evaporated plating base consisting of 200 Å of Nb and 100 Å of copper. The observed behavior is that expected when the adhesion layer does not diffuse into the copper.

Packaging structures commonly use Cr to give adhesion of copper lines to dielectrics and to protect copper against corrosion. Thus, the materials to be described with respects to FIGS. 4–7 should be compared to Cr, which is also illustrated in FIG. 3. Under the conditions of this annealing cycle, the resistivity of Cr-clad copper is always somewhat higher than that of pure copper.

The use of Cr as protection on all exposed sides of a Cu line would entail the use of a complicated process, as has been mentioned earlier. Electrochemical studies of this system indicate that electroless deposition of Cr cannot be achieved without great difficulty, if at all.

Figure 4:
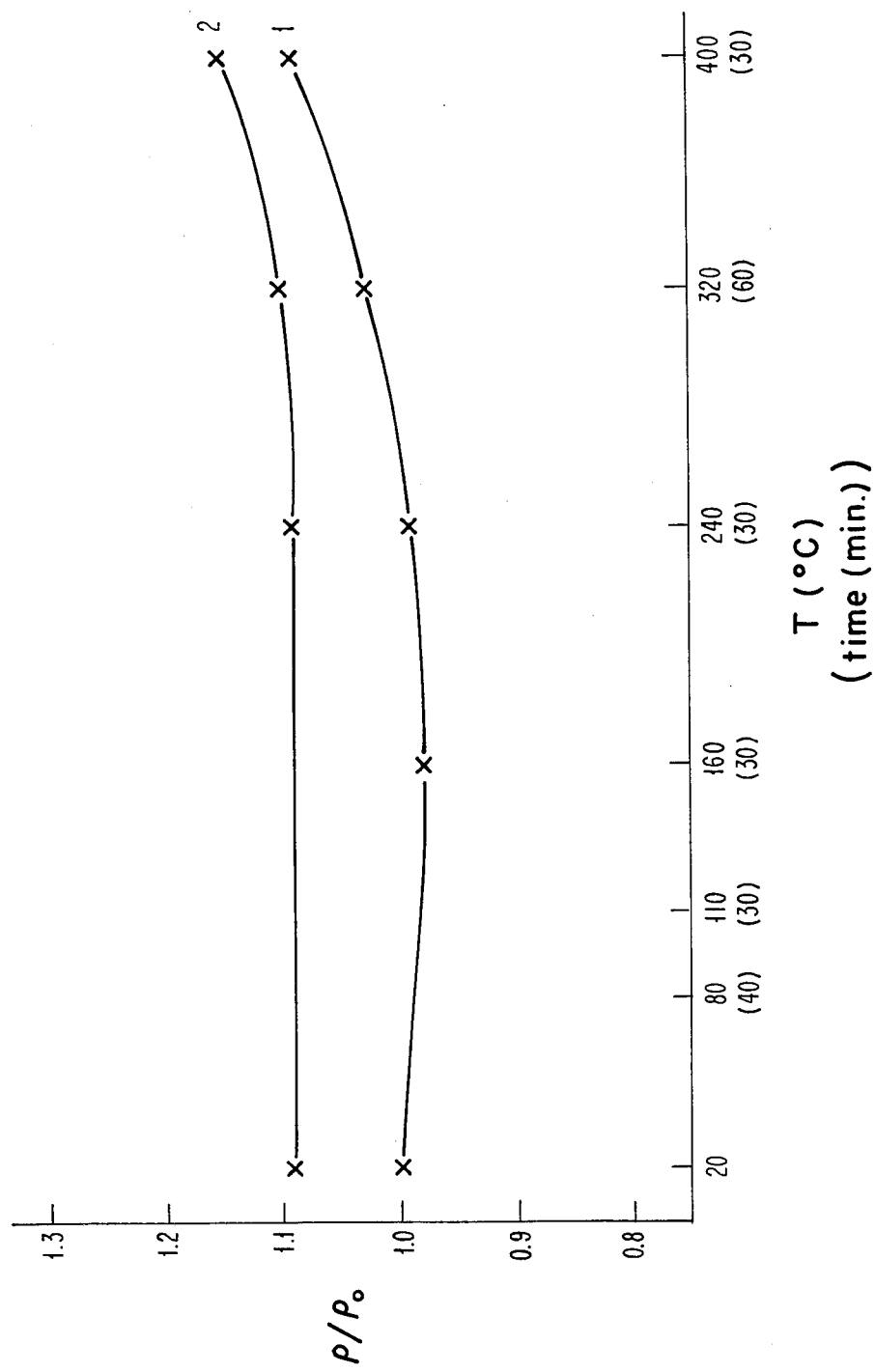
FIG. 4 is a plot showing the dependence of the relative resistivity $\rho/\rho_o$ on an annealing cycle of a copper conductor which is protected by a Ni coating. The sample was subjected to the annealing cycle two times.

FIG. 4 shows the relative resistivity behavior when a layer of Ni of thickness 1000 Å is deposited on copper. The curves are indistinguishable for evaporated and electroplated Ni. After curve 1 was obtained, the annealing cycle was begun again at room temperature to yield curve 2. Further annealing for five hours at 400° C. gave a data point $\rho/\rho_o$ of approximately 1.31 at T=4° C. The increase in resistivity of this sample indicates extensive interdiffusion of the copper and nickel, and therefore indicates that nickel is a poor protective coating.

Figure 5:
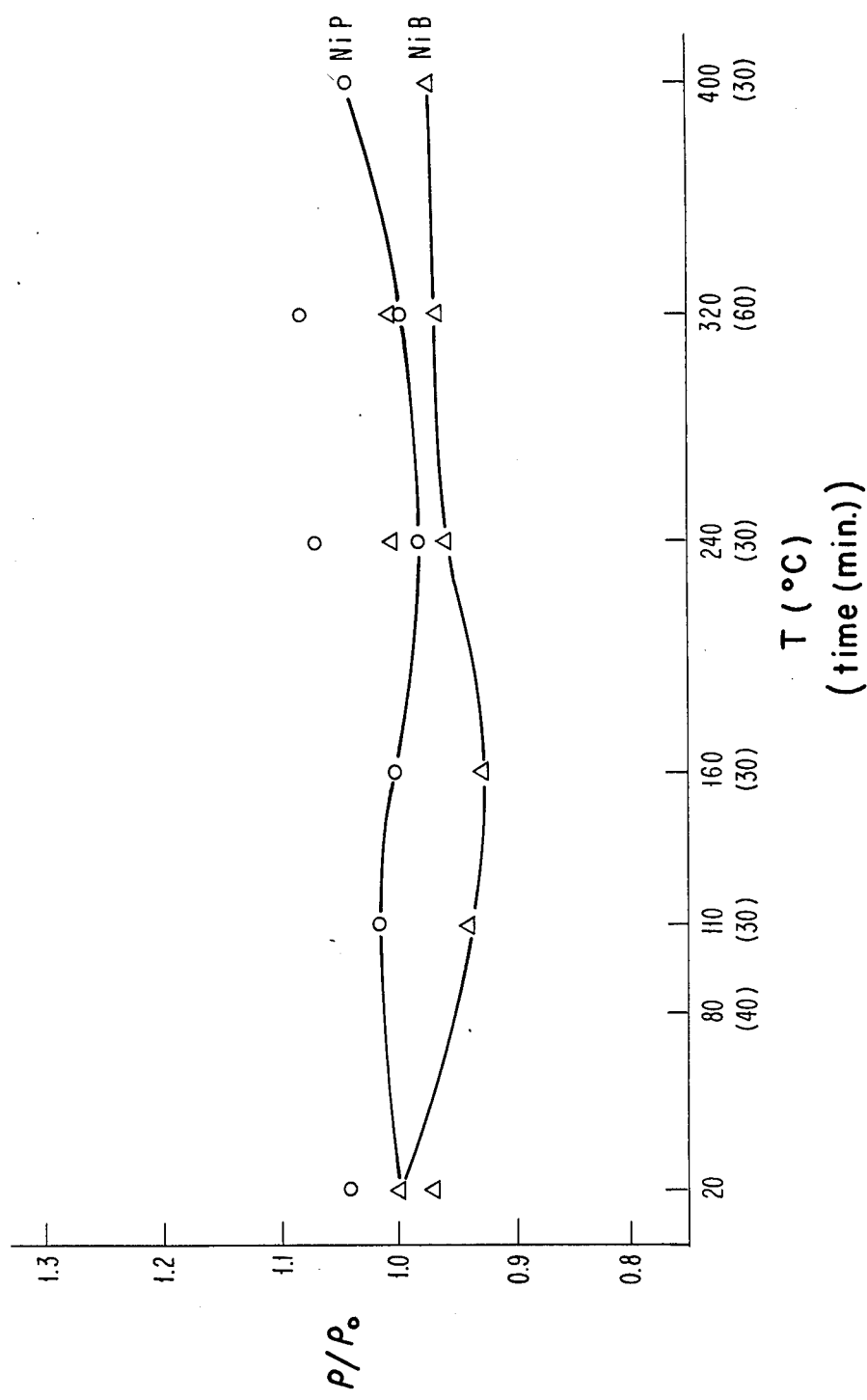
FIG. 5 is a plot of the dependence of the relative resistivity $\rho/\rho_o$ for two copper conductors, one of which is covered with NiP and the other of which is covered with NiB, during an annealing cycle.
Figure 6:
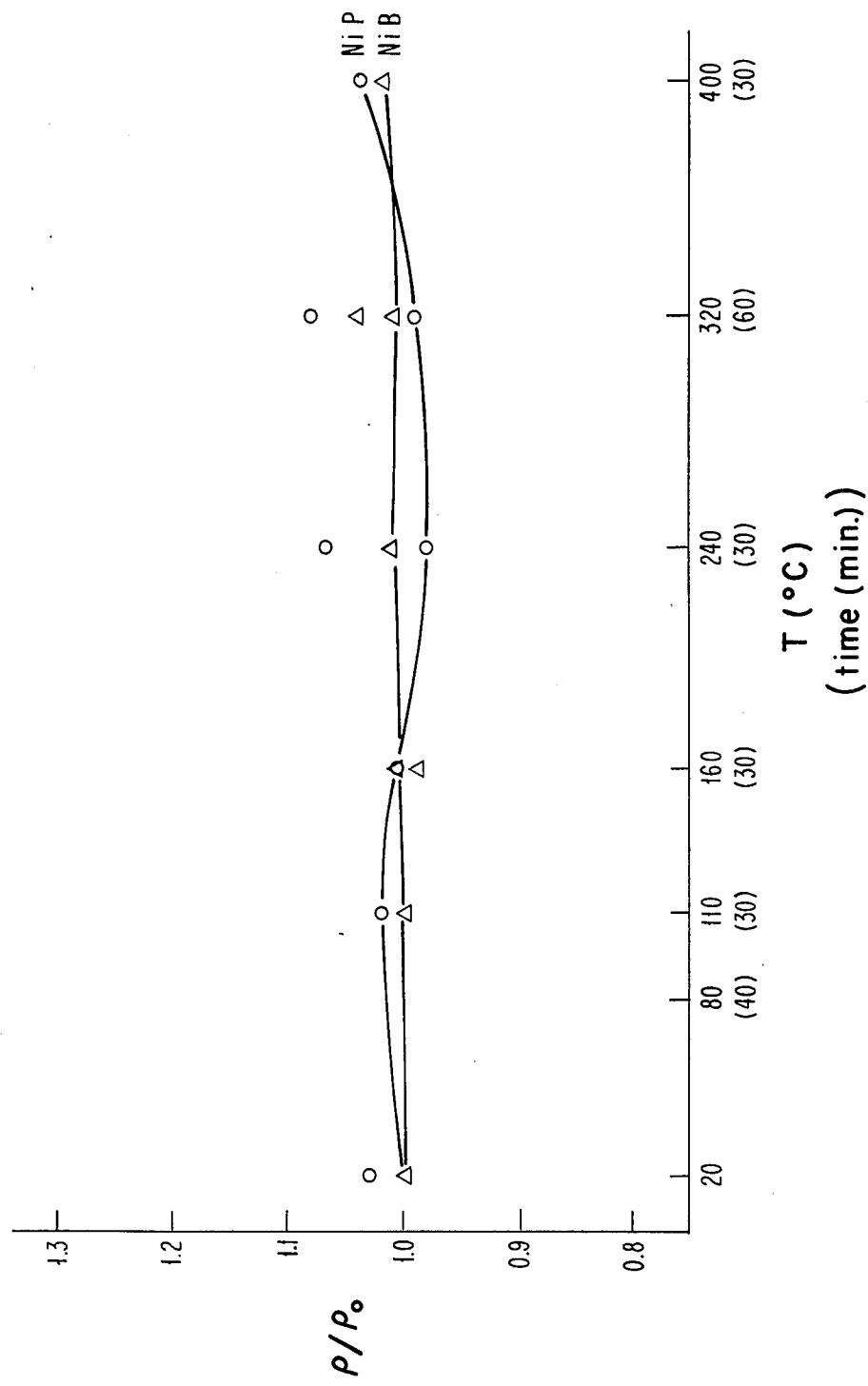
FIG. 6 is a plot showing the dependence of relative resistivity $\rho/\rho_o$ on an annealing cycle for two copper conductors, one of which is protected with a layer of NiP while the other is protected with a layer of NiB, where the compositions of NiP and NiB are different than the compositions of the corresponding protective coatings of FIG. 5.

FIGS. 5 and 6 illustrate the situation for protective coatings of NiP and NiB which were electrolessly plated. FIG. 6 shows films with higher B and P content than those in FIG. 5. These electroless Ni alloys interdiffuse less extensively with copper than does pure Ni. A clear-cut dependence on P or B concentration was not observed.

Figure 7:
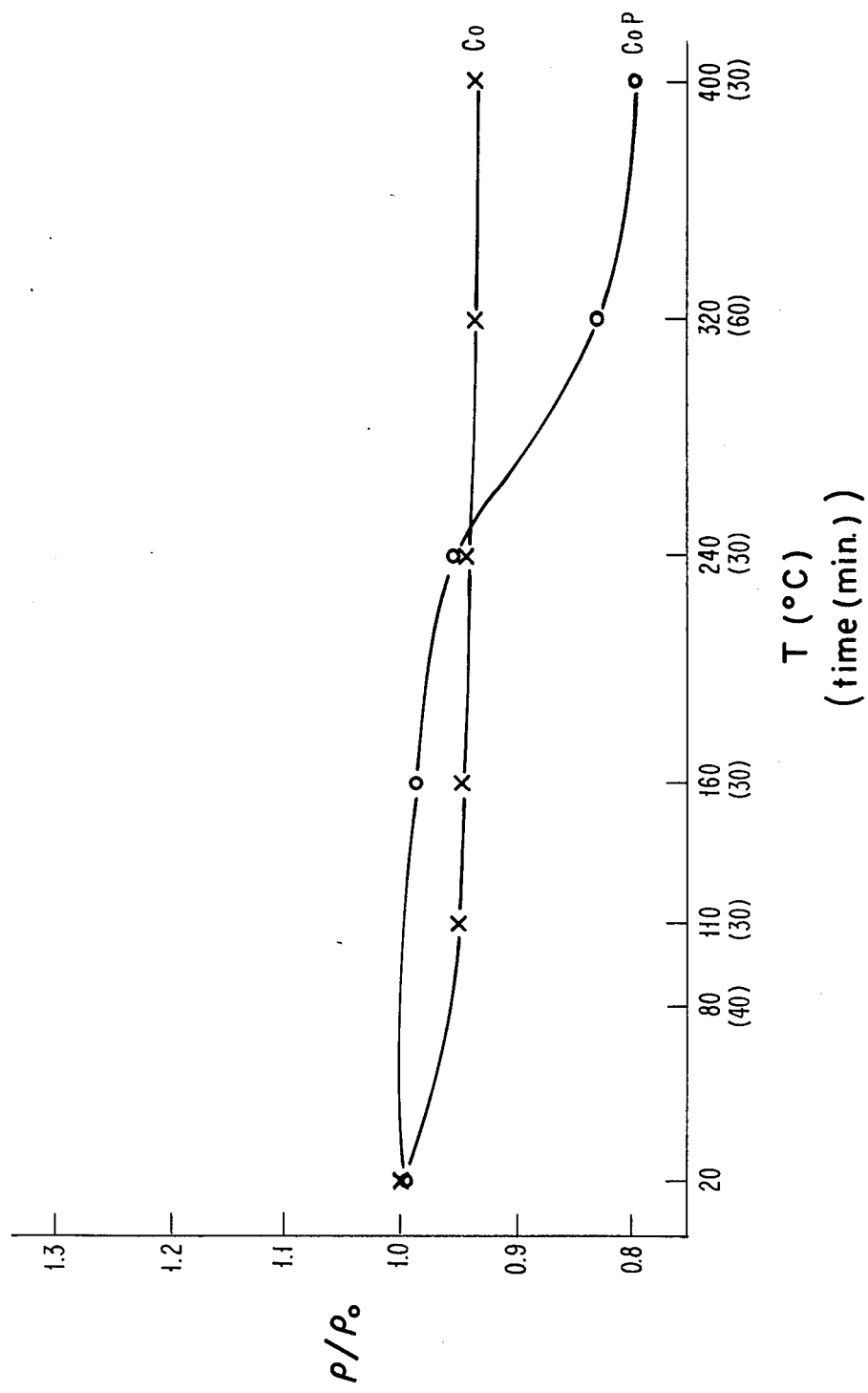
FIG. 7 is a plot of the dependence of relative resistivity $\rho/\rho_o$ of two copper conductors, one of which is protected by a coating of Co, while the other is protected by a coating of CoP in accordance with the present invention, during an annealing cycle. As is apparent from a comparison of FIGS. 3 and 7, the line protected by CoP has the lowest resistivity at the end of the annealing cycle.

FIG. 7 illustrates the use of a protective layer of Co and a protective layer of CoP containing 8% P, by weight. Pure Co interdiffuses with copper to a lesser extent than does pure Ni. FIG. 7 shows the best result obtained upon annealing of Co-coated Cu. Cobalt gives less resistivity rise than Cr (FIG. 3). However, alloying of Co with P through electroless deposition leads to even more favorable behavior. As is apparent, the curve for CoP with 8% by weight P in FIG. 7 is nearly identical to the curve for unprotected Cu in FIG. 3. Since annealing, by itself, will cause a decrease in resistivity of copper (due to effects of crystallinity, etc.), the reference base for the value of the coating is the lower curve in FIG. 3, indicating the behavior of copper in this annealing cycle. As is apparent from a comparison of FIGS. 3 and 7, only CoP provides a protection indicative of substantially no interdiffusion.

In FIG. 7, a second annealing cycle does not result in a rise in resistivity. After an additional four and one half hours at 400° C., $\rho/\rho_o$ was 0.81. Thus, these annealing studies indicate that CoP is vastly superior to other protective cladding materials. CoP was also found to give good bond strength in ultrasonic bonding of Au-coated CdCu wires.

In the practice of this invention films containing Co and P were found to provide vastly superior protection of corrosible conductors, especially those having copper therein. This protection was observed even during harsh annealing cycles, such as those used to provide electronic packages.

While the invention has been described in terms of particular embodiments thereof, it will be apparent to those of skill in the art that variations can be made without departing from the spirit and scope of the present invention.

What is claimed is:

1. A method for making a multi-level electrical structure, including the steps of:
    providing a substrate,
    forming on said substrate a first level of electrically conductive material for carrying electrical currents, said level including copper-containing metal lines to which electrical contact is made,
    forming a continuous, substantially pinhole-free protective coating on said copper-containing metal lines, said continuous coating preventing chemical attack of said metal lines during thermal cycling to elevated temperatures, said coating consisting of Co and P, said P being present in said coating in an amount of about 2% to about 15% by weight,
    forming a layer 16 of an insulating material contacting said metal lines and having acceptable dielectric properties, and
    heating said multilayer structure to an elevated temperature, wherein said continuous coating protects said metal lines durng said heating step.

2. The method of claim 1, where said metal lines are formed with a width at least about five micrometers.

3. The method of claim 2, wherein said continuous protective coating is at least about 500 angstroms thick.

4. The method of claim 2, where said continuous protective coating has a thickness ranging from about 500 angstroms to several thousand angstroms.

5. The method of claim 1, where said layer of insulating material is comprised of polyimide.

6. The method of claim 3, wherein said continuous protective coating is contains containing approximately 8 weight %P.

7. The method of claim 1, wherein said protective coating is formed by electroless deposition.

8. The method of claim 1, wherein said continuous protective coating is at least about 500 angstroms thick.

9. A method for making a multi-level structure comprising the steps of:

forming a first layer including copper on a substrate, forming a continuous, substantially pin-hole free second layer in contact with said first layer, said second layer consisting of Co and P and being thinner than said first layer, the amount of P in said continuous second layer being about 2- about 15%, by weight, forming a third layer comprised of a metal in contact with said second layer, and heating said multi-level structure to an elevated temperature, said continuous second layer substantially preventing interdiffusion between said first layer and said third layer.

10. The method of claim 9, where said third layer includes gold.

11. The method of claim 9, where the thickness of said continuous second layer is in the range of approximately 500 angstroms–several thousand angstroms.

* * * * *